(12) United States Patent
Shih

(10) Patent No.: US 7,948,047 B2
(45) Date of Patent: May 24, 2011

(54) INPUT DISPLAY

(75) Inventor: Po-Sheng Shih, Hsinchu (TW)

(73) Assignee: HannStar Display Corp., Neihu District, Taipei (TW)

( * ) Notice: Subject to any disclaimer, the term of this patent is extended or adjusted under 35 U.S.C. 154(b) by 305 days.

(21) Appl. No.: 12/417,636

(22) Filed: Apr. 3, 2009

(65) Prior Publication Data
US 2009/0230495 A1    Sep. 17, 2009

(51) Int. Cl.
*H01L 31/0376*    (2006.01)
*H01L 31/036*    (2006.01)
*H01L 31/0232*    (2006.01)
(52) U.S. Cl. .............................. 257/435; 257/59; 257/72
(58) Field of Classification Search .............. 257/59–72, 257/292–294, 431–448, E31.127
See application file for complete search history.

(56) References Cited

U.S. PATENT DOCUMENTS

| 6,759,281 | B1 * | 7/2004 | Kim et al. ...................... 438/149 |
| 7,858,982 | B2 * | 12/2010 | Lee et al. ......................... 257/59 |
| 2005/0018111 | A1 * | 1/2005 | Tak ............................... 349/110 |

* cited by examiner

*Primary Examiner* — Cuong Q Nguyen
(74) *Attorney, Agent, or Firm* — Winston Hsu; Scott Margo

(57) ABSTRACT

An input display is provided in the present invention. The input display includes a thin film transistor (TFT) and a light blocking layer. The TFT includes a low-field electrode, a high-field electrode connected to the low-field electrode with a connecting section, and a field-effect area positioned on the connecting section and connected to the high-field electrode, wherein a PN junction field is formed in the field-effect area when the TFT is switched off. The light blocking layer corresponds to the high-field electrode and hides the field-effect area from all incident light from the TFT.

20 Claims, 12 Drawing Sheets

INPUT DISPLAY

CROSS REFERENCE TO RELATED APPLICATIONS

This application claims priority from U.S. application Ser. No. 11/335,042 by Shih, Po-Sheng, filed on Jan. 18, 2006, entitled "INPUT DISPLAY".

FIELD OF THE INVENTION

The present invention relates to an input display, and more particularly to an input display with a light detector array.

BACKGROUND OF THE INVENTION

Please refer to FIG. 1, which is a circuit diagram showing a light detector array of an input display according to the first prior art.

In FIG. 1, each unit of the light detector array includes a TFT switch. For example, the operation of the unit 11 in the position where the first read-out line intersects the first gate line is as follows. When the light detector array is OFF, the gate line 1 is at low voltage. The body diode of the TFT is reversely biased so that there is no current flowing through the TFT. When the gate line 1 turns to high voltage, the current flows from gate line 1 through read-out line 1 to the readout amplifier 12.

A photo-induced ON current occurs when the light is emitted onto the TFT. When the light is emitted onto the TFT, the photo-induced ON current increases. Contrarily, when no light is emitted onto the TFT, the photo-induced ON current decreases.

When the input display with the light detector array is used, the touch of the display will influence the quantity of the incident light. Hence, which position of the display has been touched is able to be detected by sensing the quantity of the photo-induced ON current.

However, the drawback of the input display with the light detector array is the generation of the photo-induced leakage current, which also occurs when the light is emitted onto the TFT. The sensing and the detection of the display are seriously held back by the photo-induced leakage current.

To overcome the drawback, another implementation of the display has been provided. Please refer to FIG. 2, which is a circuit diagram showing a light detector array of an input display according to the second prior art.

In FIG. 2, each unit of the light detector array includes two TFT switches. The unit 21 in the position where read-out line #1 intersects gate line #1 is taken for example. The switch-TFT 11 is arranged for switching and the photo-TFT 11 is arranged for detecting the intensity of the incident light.

In FIG. 2, the additional TFT is unnecessary to be emitted by the incident light, so the photo-induced leakage current is able to be decreased. However, the increased number of TFT results in a lower process yield.

SUMMARY OF THE INVENTION

It is therefore an object of the present invention to provide an input display with a light detector array. The input display is able to be fabricated in a higher aperture ratio and a higher production yield. Besides, the input display has enough photo-induced ON current when the TFTs are switched ON and has no photo-induced leakage current when the TFTs are switched OFF.

It is another object of the present invention to achieve the above-mentioned object by appropriately designing a pixel unit with a light blocking layer which hides a field-effect area positioning on a connecting section between a high-field electrode and a low-field electrode and near the high-field electrode from all incident light from the pixel unit.

Preferably, the light blocking layer is a black matrix positioning on a color filter or a metal layer positioning on a passivation layer in the pixel unit.

For the convenience of description, the embodiments of invention are illustrated in the structure of an n-type TFT. However, it is obvious to one skilled in the art to apply the technical characteristics of the invention in the applications of a p-type TFT, a poly-TFT, and a TFT-LCD.

Please refer to FIG. 3(a) and FIG. 3(b). FIG. 3(a) is a cross-sectional view of an n-type TFT of a light detector array. FIG. 3(b) is a diagram showing the band of the n-type TFT when it is switched ON and OFF respectively. In FIG. 3(a), the partial n-type TFT structure 30 is composed of a substrate 301, a metal layer 302, a gate insulator layer 303, an amorphous silicon layer 304, a $N^+$ amorphous silicon layer 305, a drain terminal 306, and a source terminal 307. The metal layer 302 is used as a gate terminal. The band diagram in FIG. 3(b) is shown with respect to the dotted line drawn in FIG. 3(a).

In FIG. 3(b), a conduction band 311, a valence band 312, a channel 313, a drain terminal 314, a source terminal 315, holes 316, and electrons 317 are symbolized in ON state 31, while a conduction band 321, a valence band 322, a channel 323, a drain terminal 324, a source terminal 325, holes 326 and 328, electrons 327 and 329, and PN junction 320 are symbolized in OFF state 32. The band diagrams are both drawn corresponding to the n-type TFT structure 30 in FIG. 3(a), so the high-field electrode is defined as a drain terminal and the low-field electrode is defined as a source terminal.

When the TFT is switched ON in the ON state 31, the electrons 317 in the valence band 312 are transferred to the conduction band 311 due to the emitting of the incident light (not shown) and holes 316 are generated accordingly. Then the electrons 317 move toward the drain terminal 314 and the holes move toward the source terminal 315 due to the effect of the electric field, so that a photo-induced ON current (not shown) occurs between the drain terminal 314 and the source terminal 315.

When the TFT is switched OFF in the OFF state 32, the gate terminal (not shown) is connected to a low voltage. At this time, the bands 321 and 322 in most of the area between the drain terminal 324 and the source terminal 325 are almost horizontal. That is, there is no electric field existing in this area. The electrons 327 in this region will just be transferred from the valence band 322 to the conduction band 321 and will be combined with the holes 326 repeatedly, even though the light (not shown) has been emitted onto the electrons (327). There is no assistance for the increase of the current. However, the current formed by an electric field, which occurs due to the transferring of the holes 328 and the electrons 329, in a PN junction 320 existing near the drain terminal 324 constitutes the aforementioned photo-induced leakage current.

According to the first aspect of the present invention, an input display is provided. The input display includes a thin film transistor (TFT) and a light blocking layer. The TFT includes a low-field electrode, a high-field electrode connected to the low-field electrode with a connecting section, and a field-effect area positioned on the connecting section and connected to the high-field electrode, wherein a PN junction field is formed in the field-effect area when the TFT is switched off. The light blocking layer corresponds to the high-field electrode and hides the field-effect area from all incident light from the TFT.

According to the second aspect of the present invention, a pixel unit is provided. The pixel unit is composed of the TFT and the light blocking mentioned in the previous paragraph.

According to the third aspect of the present invention, an elimination method for a photo-induced leakage current of an input display is provided. The elimination method includes steps of providing a thin film transistor (TFT) including a low-field electrode, a high-field electrode connected to the low-field electrode with a connecting section, and a field-effect area positioned on the connecting section and connected to the high-field electrode, and hiding the field-effect area from all incident light from the TFT so that the photo-induced leakage current produced by a plurality of electrons influenced by the incident light and the PN junction field formed in the field-effect area when the TFT is switched off is eliminated.

The every aspects of the present invention are suitable in the application of an n-type TFT, a p-type TFT, a poly-TFT, and an n-type transistor or a p-type transistor with a channel made of semiconductor layer, such as a-Si, poly-Si, single crystalline Si, III-V compounds . . . etc., or organic materials. Moreover, they are also suitable for the combination of the fabrication process of a TFT-LCD to widen the utility in the industrial application.

The foregoing and other features and advantages of the present invention will be more clearly understood through the following descriptions with reference to the drawings, wherein:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
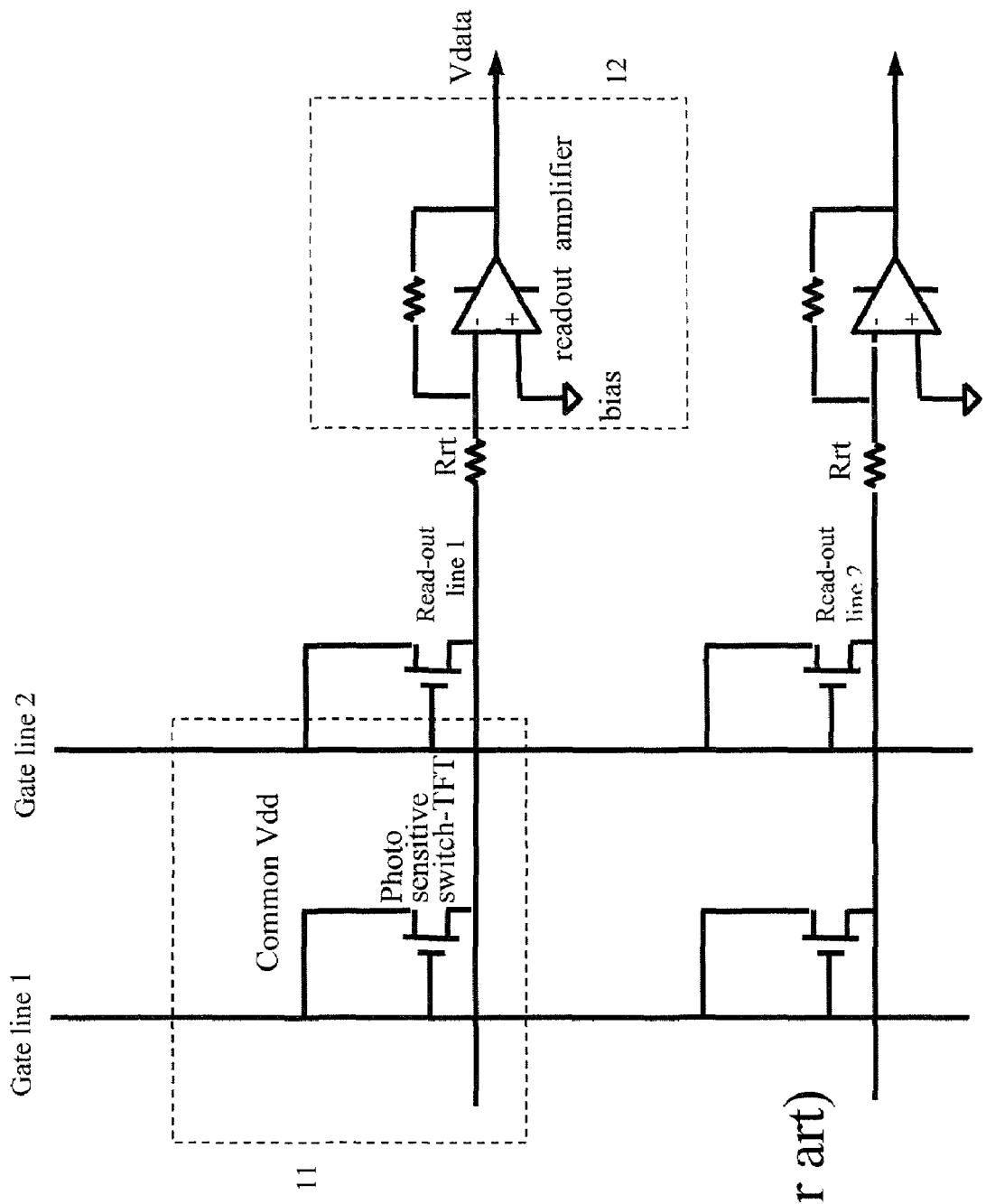
FIG. 1 is a circuit diagram showing a light detector array of an input display according to the first prior art.
Figure 2:
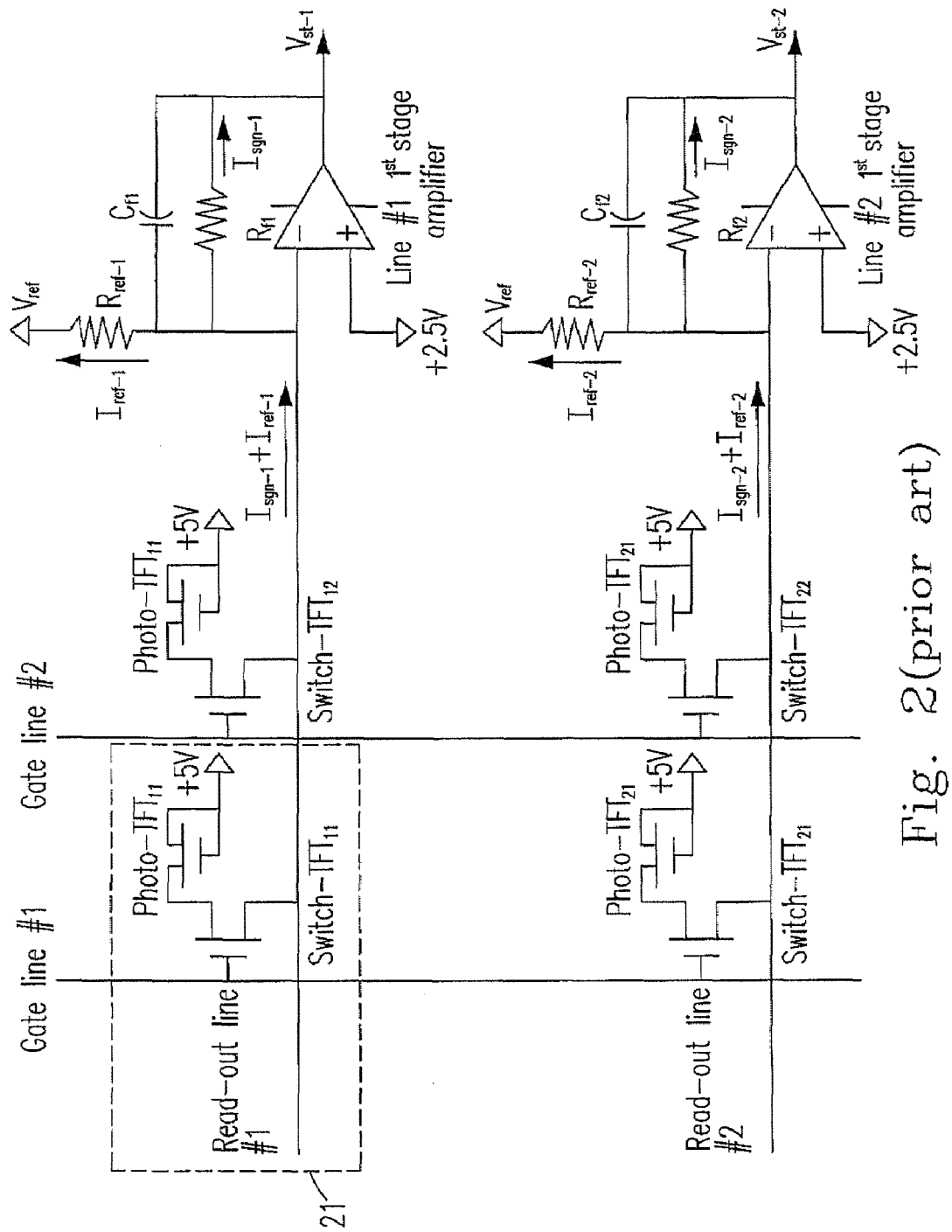
FIG. 2 is a circuit diagram showing a light detector array of an input display according to the second prior art.
Figure 3A:
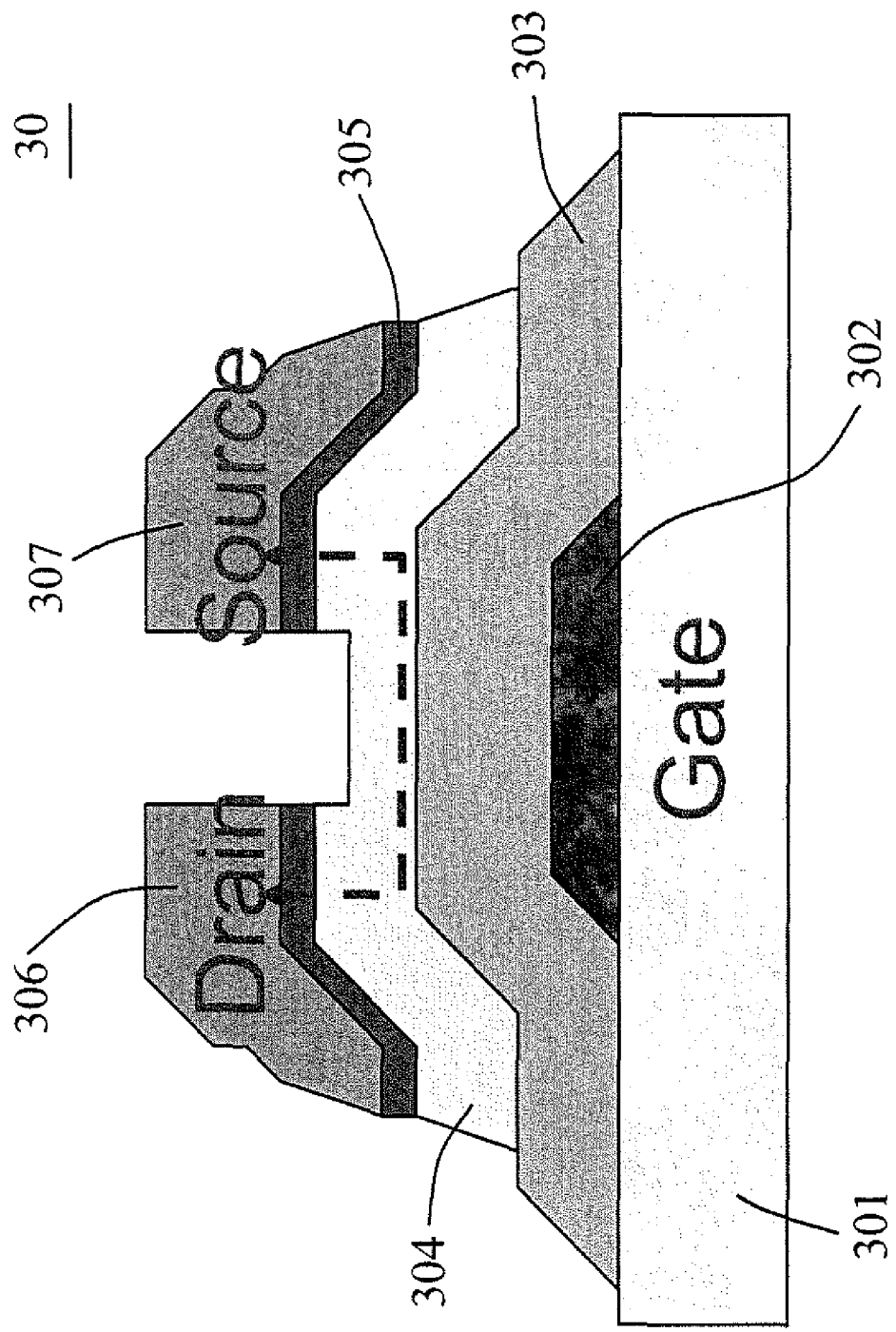
FIG. 3(a) is a cross-sectional view of an n-type TFT of a light detector array.
Figure 3B:
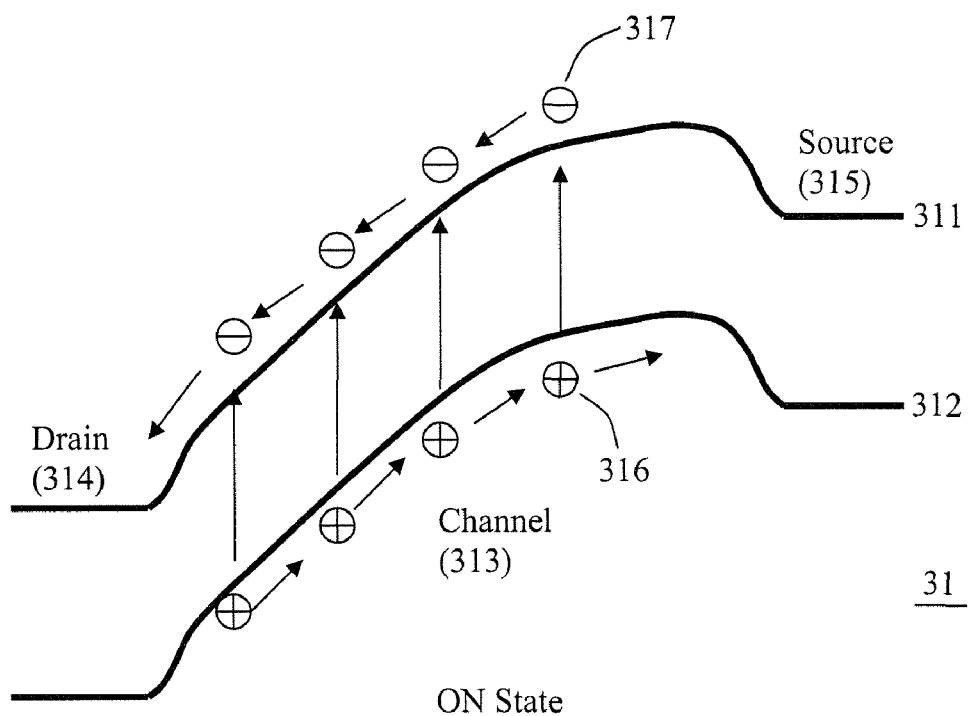
FIG. 3(b) is a diagram showing the band of the n-type TFT along the dotted line of FIG. 3(a) when the TFT is switched ON and OFF respectively.
Figure 3B:
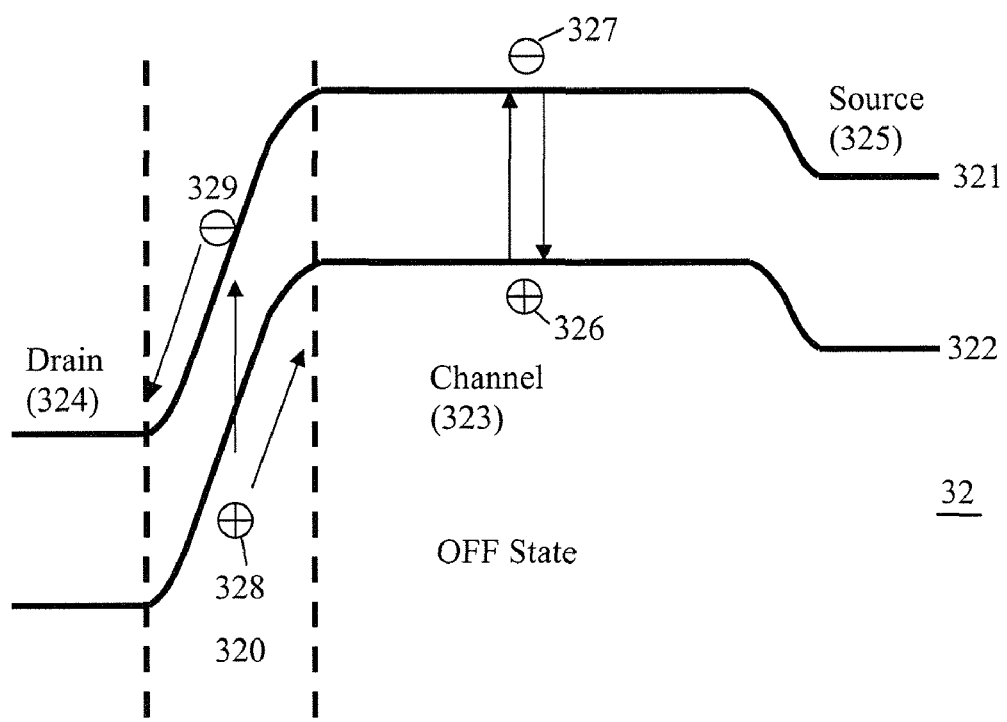
Figure 4A:
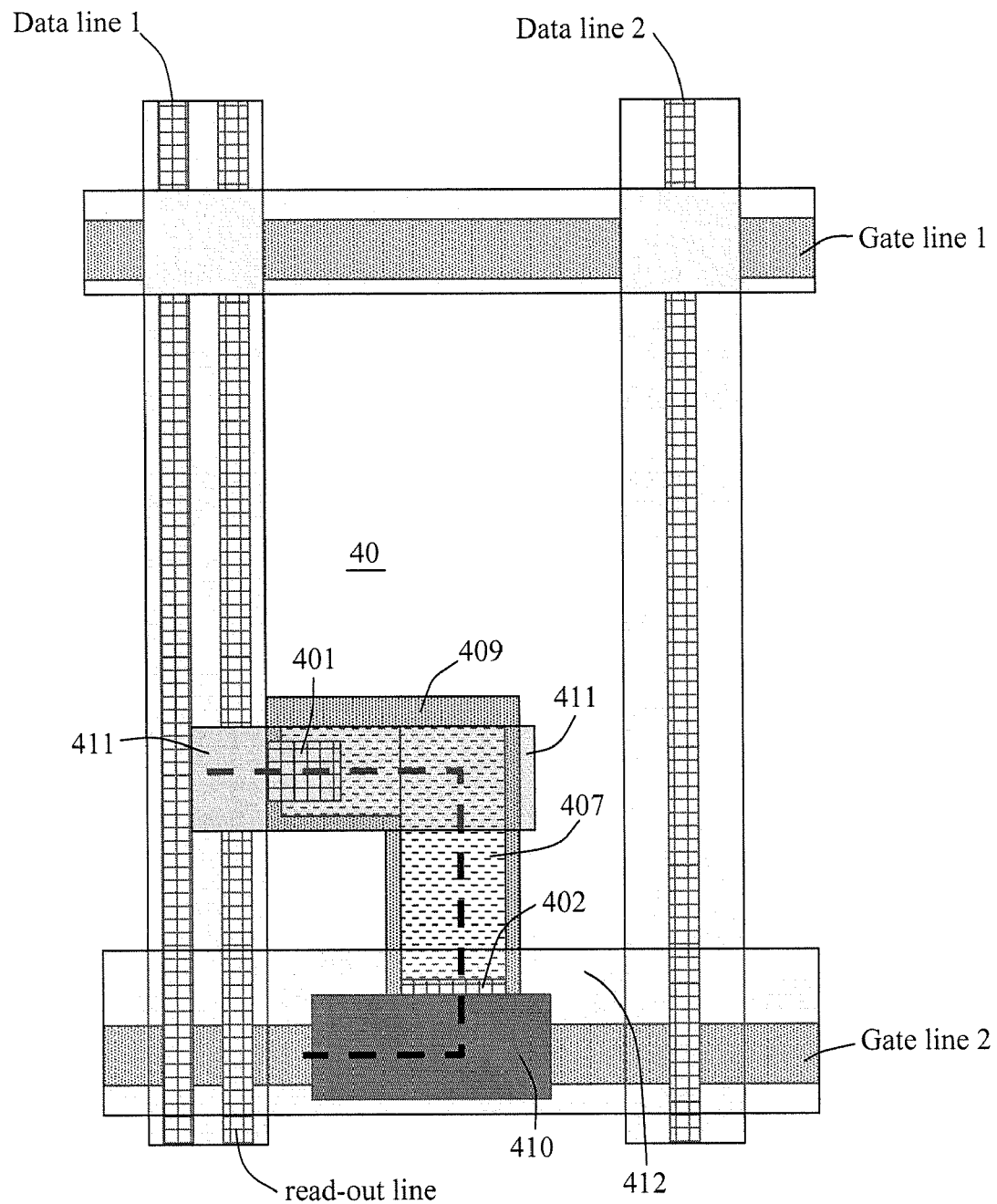
FIG. 4(a) is an upper view of an n-type TFT of a light detector array according to the first embodiment of the present invention.
Figure 4B:
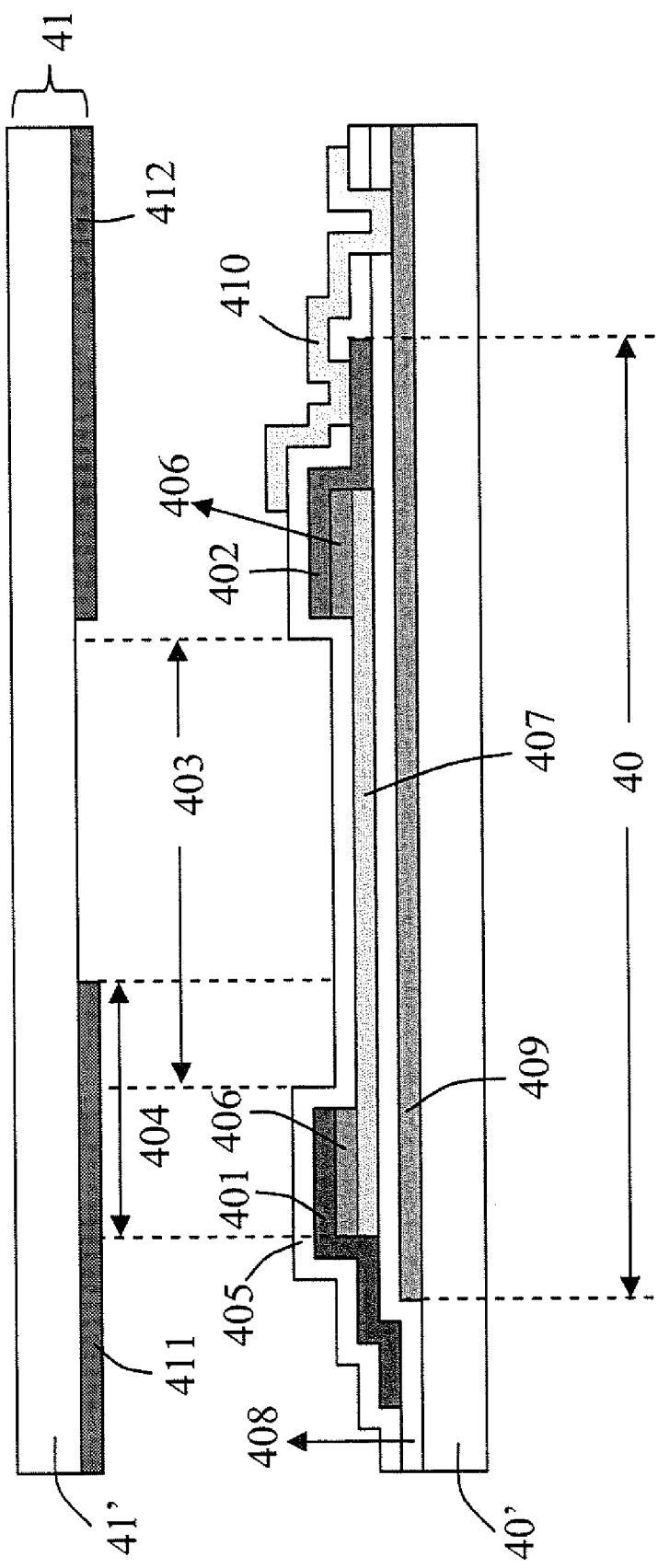
FIG. 4(b) is a cross-sectional view showing the structure of FIG. 4(a) along the dotted line.

Please refer to FIG. 4(a) and FIG. 4(b). FIG. 4(a) is an upper view of an n-type TFT of a light detector array according to the first embodiment of the present invention, and FIG. 4(b) is a cross-sectional view showing the structure of FIG. 4(a) along the dotted line. In FIG. 4(a), the TFT 40 is in the area surrounded by data line 1, data line 2, read-out line, gate line 1, and gate line 2 while the remaining components in the area are omitted for the convenience of illustration. The TFT 40 in FIG. 4(a) is implemented to correspond to the photo sensitive switch TFT 11 surrounded by gate line 1, gate line 2, and read-out line 1 shown in FIG. 1. In the upper view of FIG. 4(a), only a part of the components of TFT 40 are shown. To clarify the structure of the TFT 40 of FIG. 4(a), the description for FIG. 4(b) is given firstly as follows.

The main object of the invention is to provide a pixel unit and an input display implemented with a plurality of such pixel unit. As the first embodiment of the present invention, both of the pixel unit and the input display are based on the TFT 40 shown in FIG. 4(b).

In FIG. 4(b), the TFT 40 includes at least a high-field electrode 401, a low-field electrode 402, a connecting section 403 for connecting the high-field electrode 401 and the low-field electrode 402, and a metal layer 409. The high-field electrode 401 is connected to the read-out line and the metal layer 409 is connected to the gate line 2. As FIG. 4(b) shows, the connecting section 403 is mainly composed of an amorphous silicon layer 407 and the whole TFT 40 is fabricated on a substrate 40'.

When the TFT 40 is switched OFF, a PN junction field occurs in a field-effect area 404 in part of the connecting section 403 near the high-field electrode 401. When the light is emitted to the field-effect area 404, the electrons would be affected by the incident light and the PN junction field so that a photo-induced leakage current is generated. The object of the invention is to eliminate the photo-induced leakage current.

The n-type TFT 40 is taken for example in FIG. 4, so the high-field electrode 401 and the low-field electrode 402 can be defined as a drain terminal and a source terminal respectively while the gate terminal 409 is at low voltage. If a p-type TFT, however, is taken for another embodiment of the present invention, then the high-field electrode 401 and the low-field electrode 402 should be defined as a drain terminal and a source terminal respectively while the gate terminal 409 is at high voltage. For one skilled in the art, the invention needs not be limited to the disclosed n-type TFT and is easy to be deduced in the applications of the p-type TFT and the poly-TFT.

In the n-type TFT 40 shown in FIG. 4, the high-field electrode 401 and the low-field electrode 402 are defined as a drain terminal and a source terminal respectively. There is a passivation layer 405 covering the high-field electrode 401, the low-field electrode 402 and the connecting section 403. Besides, below the high-field electrode 401 and the low-field electrode 402 are sequentially a N+ amorphous silicon layer 406, an amorphous silicon layer 407, a gate insulator layer 408 and the gate terminal 409. There is further an indium-tin-oxide (ITO) layer 410 covering the passivation layer 405 corresponding to the source terminal 402. The ITO layer 410 is also connected to the metal layer 409 so as to connect the low field electrode 402 to the metal layer 409. The operation of the low voltage is as described in FIG. 1 and will be omitted here.

According to the object of the invention, a light blocking layer is introduced in order to eliminate the photo-induced leakage current. In the first embodiment of FIG. 4, a color filter (CF) 41 composed of a first black matrix (BM) 411, a second BM 412, and a substrate 41' is provided. The first BM is adopted as the light blocking layer to hide the field-effect area 404 from all incident light, so that the light will never emit to or through the field-effect area 404. Hence, the photo-induced leakage current will be eliminated when the TFT 40 is switched OFF, and the photo-induced ON current will still be hold when the TFT 40 is switched ON.

In the practical fabrication process, the width of the field-effect area 404 is limited between 1 um and 5 um. Yet the key point of the first embodiment is not the value of the width but is that the BM 411 should be able to hide the field-effect area 404 from all incident light perfectly, as shown in FIG. 4(b).

In the production process of a display, the defect of the shifting between layers often occurs. For solving such a defect, in the present invention, the TFT 40 is implemented as the L-type structure shown in FIG. 4(a). The TFT structure 40 is set at an angle with respect to the electric field of the PN junction. The angle in this embodiment is 90°.

Although the first embodiment is given in the application of an n-type TFT, the present invention is still suitable for the application of a p-type TFT and a poly-TFT. Besides, it can also be utilized for the combination of the fabrication process of a TFT-LCD to widen the utility in the industrial application.

Figure 5A:
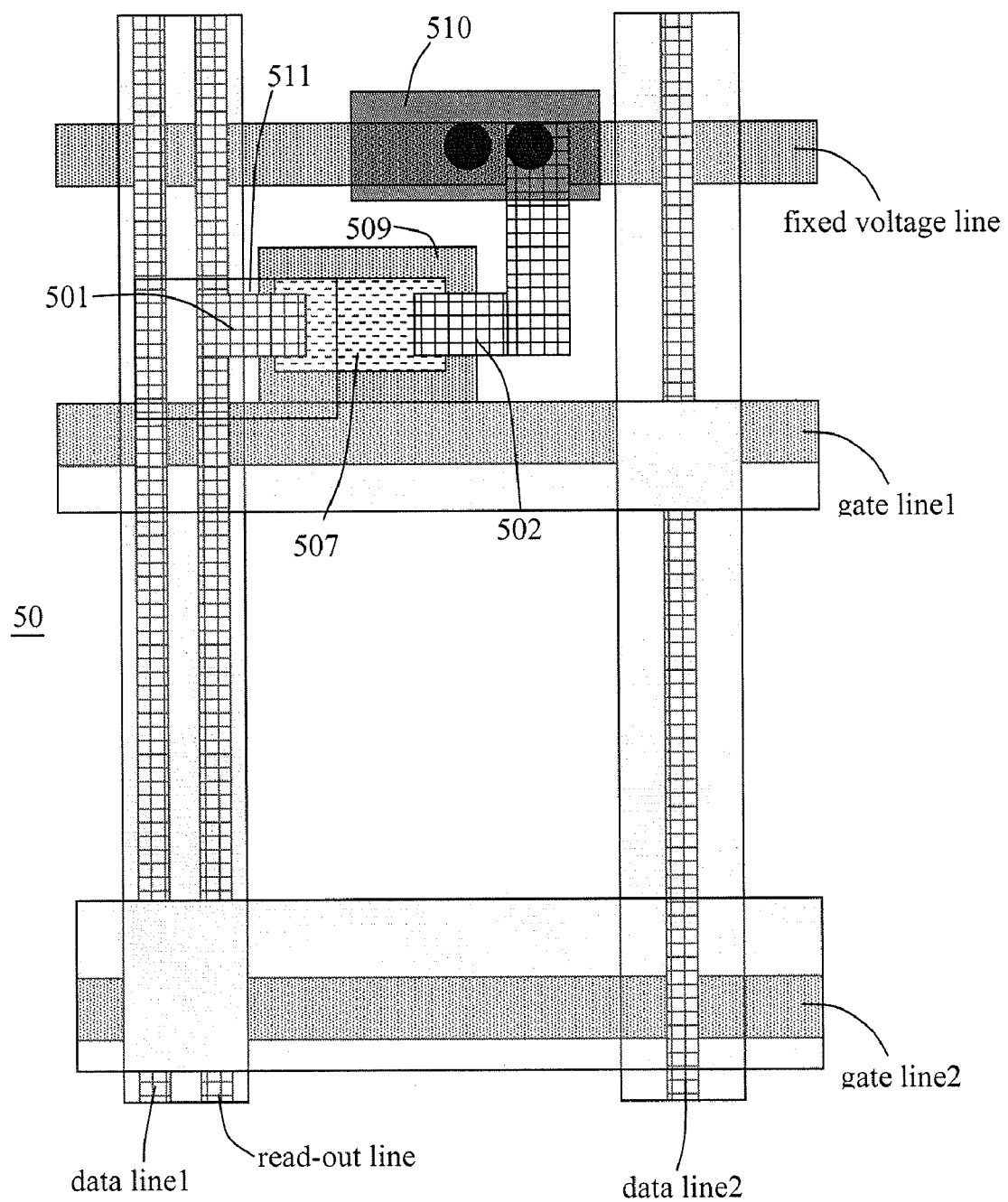
FIG. 5(a) is an upper view of an n-type TFT of a light detector array according to the second embodiment of the present invention.
Figure 5B:
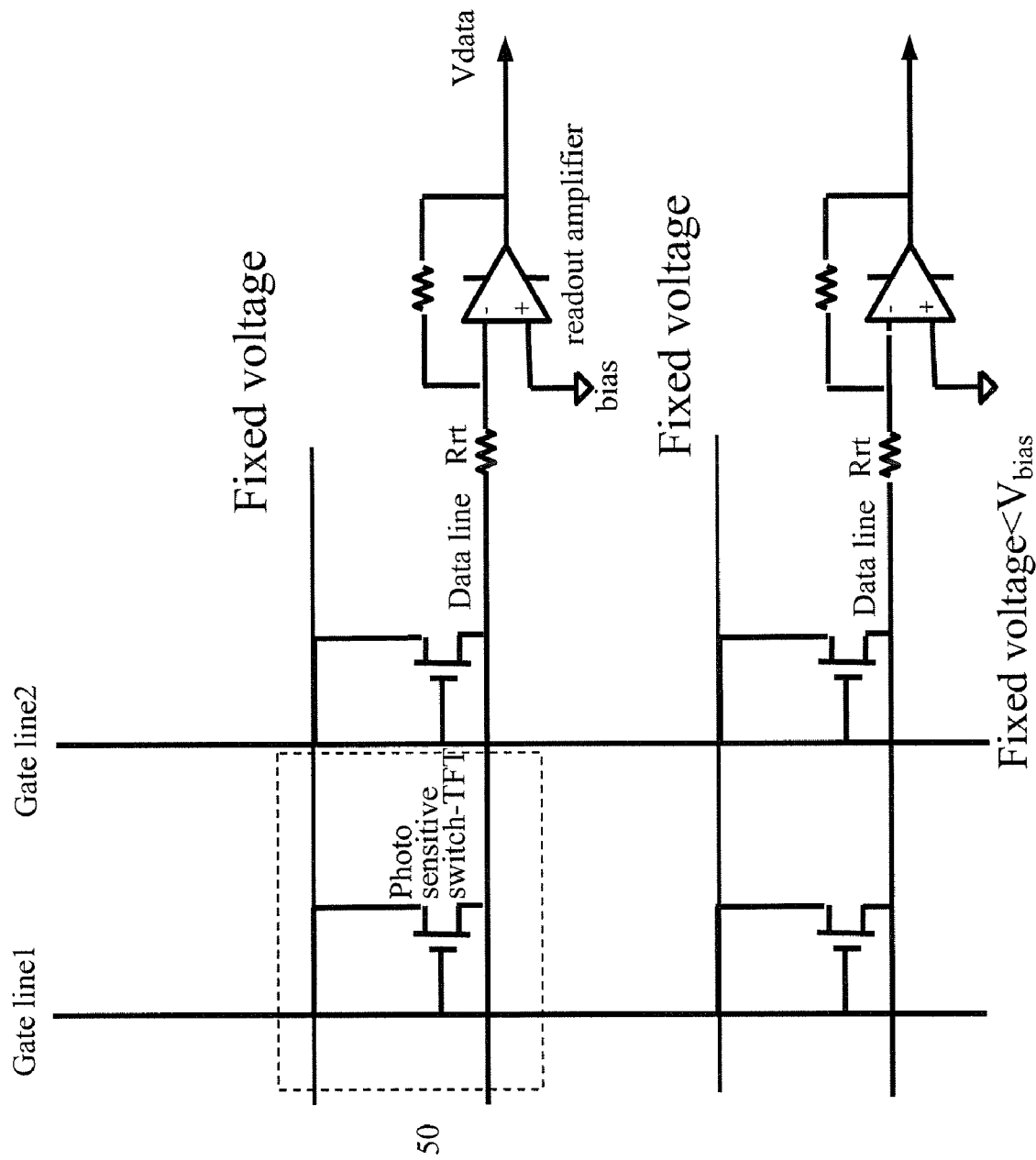
FIG. 5(b) is a circuit diagram showing the light detector array fabricated with the n-type TFT of FIG. 5(a)

Please refer to FIG. 5(a) and FIG. 5(b). FIG. 5(a) is an upper view of an n-type TFT of a light detector array according to the second embodiment of the present invention, and FIG. 5(b) is a circuit diagram showing the light detector array fabricated with the n-type TFT of FIG. 5(a). In FIG. 5(a), the TFT 50 is in the area surrounded by data line 1, data line 2, read-out line, gate line 1, and fixed voltage line while the remaining components in the area are omitted for the convenience of illustration. The TFT 50 in FIG. 5(a) is implemented to correspond to the photo sensitive switch TFT 50 shown in FIG. 5(b).

Similar to FIG. 4(a) and FIG. 4(b), the equivalent components are given the same symbols in FIG. 5(a). To clarify the operation of the TFT 50 in FIG. 5(a), the description will be given by referring to FIG. 5(b) firstly. In FIG. 5(b), because the voltage level of the fixed voltage line is lower than the voltage level (Vbias) of the read-out line, the TFT 50 is OFF and the body diode of the TFT 50 is reversely biased. When the gate line 1 turns to high voltage, the current flows from the fixed voltage line through read-out line 1 to the readout amplifier 12.

The technical characteristic of this embodiment is also to adopt the BM 511 as the light blocking layer to hide the field-effect area near the drain terminal 501 from all incident light, so that the light will never emit to or through the field-effect area. Hence, the photo-induced leakage current will be eliminated when the TFT 50 is switched OFF, and the photo-induced ON current will still be hold when the TFT 50 is switched ON. However, the difference between FIG. 5 and FIG. 4(a) (or FIG. 4(b)) is that the source terminal 502 is not short-connected to the gate terminal 509 but is connected to the fixed voltage line as FIG. 5(a) shows. The drain terminal is still connected to the read-out line.

The n-type TFT 50 is taken for example in FIG. 5, so the high-field electrode 501 and the low-field electrode 502 can be defined as a drain terminal and a source terminal respectively while the gate terminal 509 is at low voltage. If a p-type TFT, however, is taken for another embodiment of the present invention, then the high-field electrode 501 and the low-field electrode 502 should be defined as a drain terminal and a source terminal respectively while the gate terminal 509 is at high voltage. For one skilled in the art, the invention needs not be limited to the disclosed n-type TFT and is easy to be deduced in the applications of the p-type TFT and the poly-TFT.

Figure 6A:
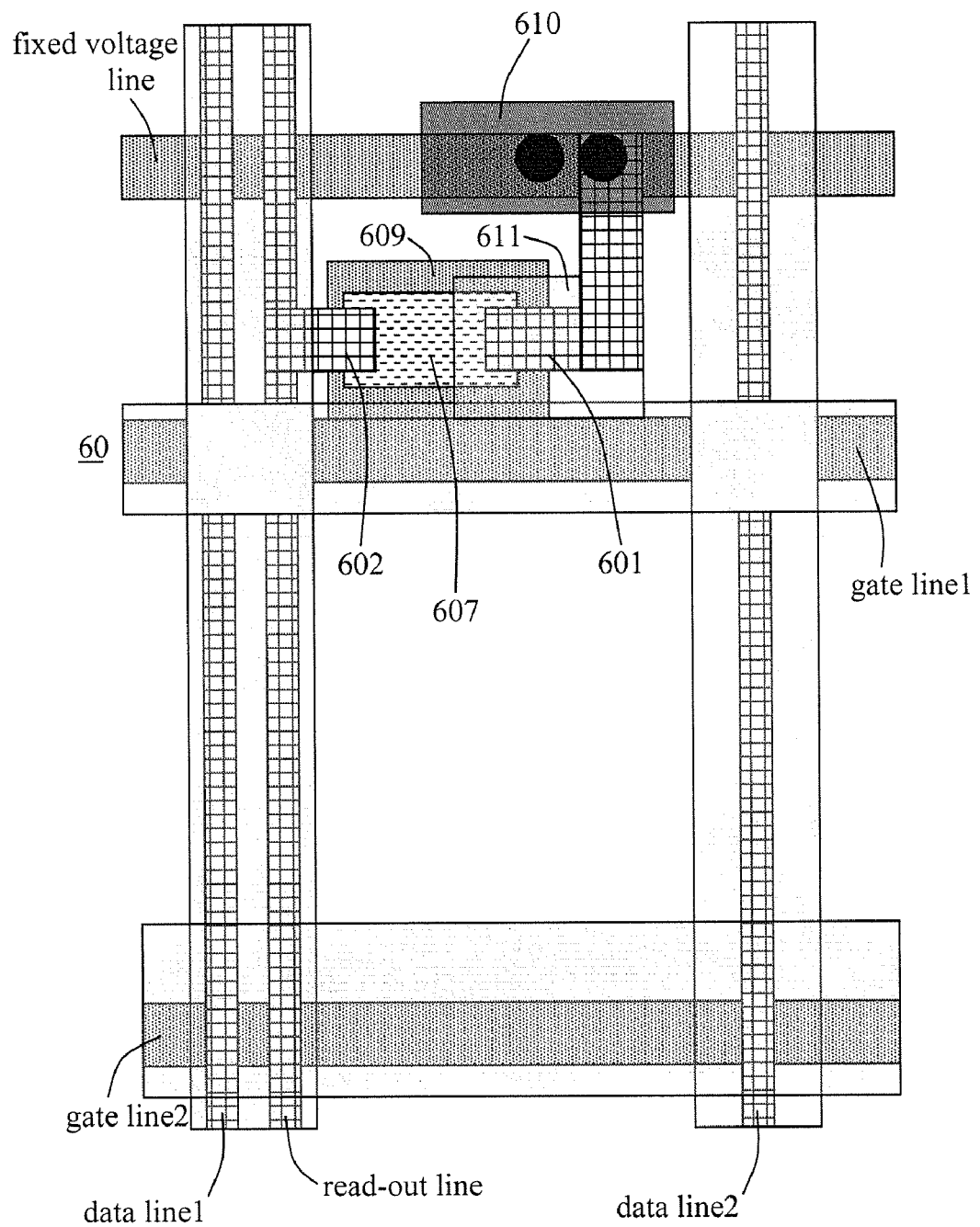
FIG. 6(a) is an upper view of a TFT of a light detector array according to the third embodiment of the present invention.
Figure 6B:
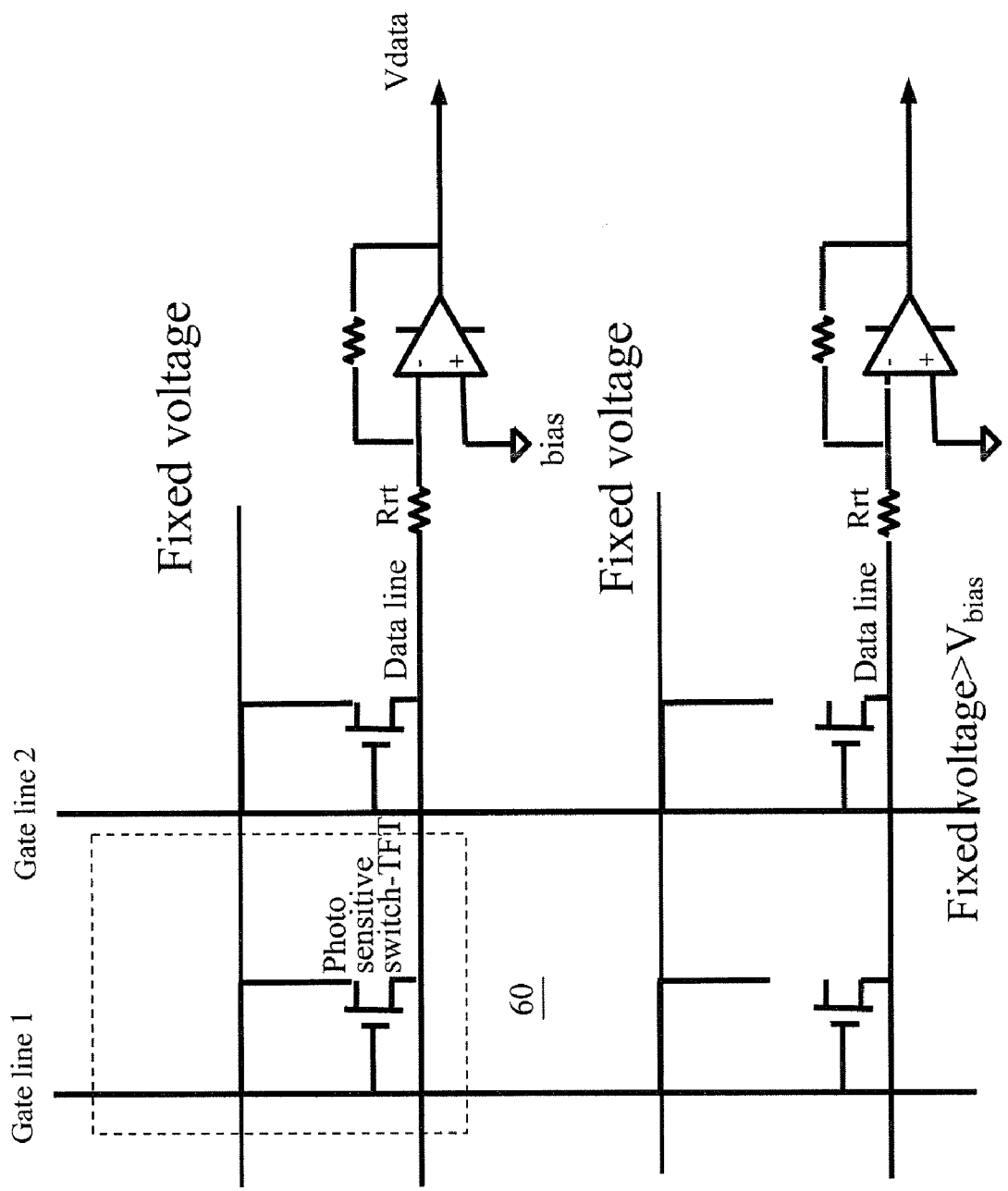
FIG. 6(b) is a circuit diagram showing the light detector array fabricated with the TFT of FIG. 6(a)

Please refer to FIG. 6(a) and FIG. 6(b). FIG. 6(a) is an upper view of a TFT of a light detector array according to the third embodiment of the present invention, and FIG. 6(b) is a circuit diagram showing the light detector array fabricated with the TFT of FIG. 6(a). In FIG. 6(a), the TFT 60 is in the area surrounded by data line 1, data line 2, read-out line, gate line 1, and fixed voltage line while the remaining components in the area are omitted for the convenience of illustration. The TFT 60 in FIG. 6(a) is implemented to correspond to the photo sensitive switch TFT 60 shown in FIG. 6(b).

Similar to FIG. 4(a) and FIG. 4(b), the equivalent components are given the same symbols in FIG. 6(a). Although the technical characteristic of this embodiment is also to adopt the BM 611 as the light blocking layer to hide the field-effect area, the position of the BM 611 in FIG. 6(a) is opposite to the position of the BM 511 in FIG. 5(a). That is, the BM 611 is fabricated to hide the high-field electrode 601 which is connected to the fixed voltage line. The low-field electrode 602 is still connected to the read-out line.

To clarify the operation of the TFT 60 in FIG. 6(a), the description will be given by referring to FIG. 6(b) firstly. In FIG. 6(b), because the voltage level of the fixed voltage line is now higher than the voltage level (Vbias) of the read-out line, the blocking fabrication of the BM 611 in FIG. 6(a) is different from the blocking fabrication of the BM 511 in FIG. 5(a).

The circuit implementation of the structure in FIG. 5 is shown in FIG. 6. Compared with the circuit of the prior art shown in FIG. 1, the TFTs in FIG. 6 are controlled by a constant voltage.

Figure 7A:
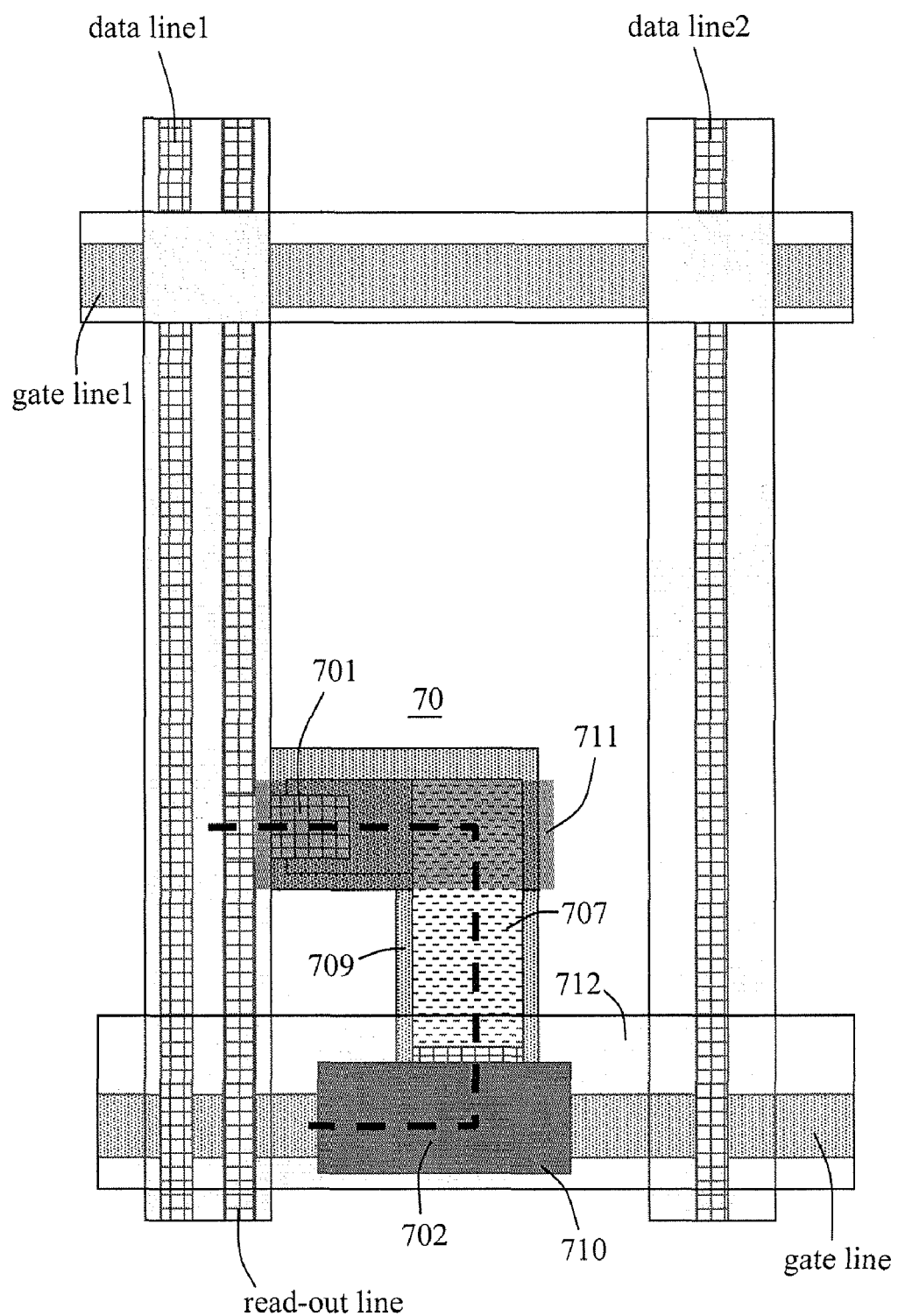
FIG. 7(a) is an upper view of an n-type TFT of a light detector array according to the fourth embodiment of the present invention.
Figure 7B:
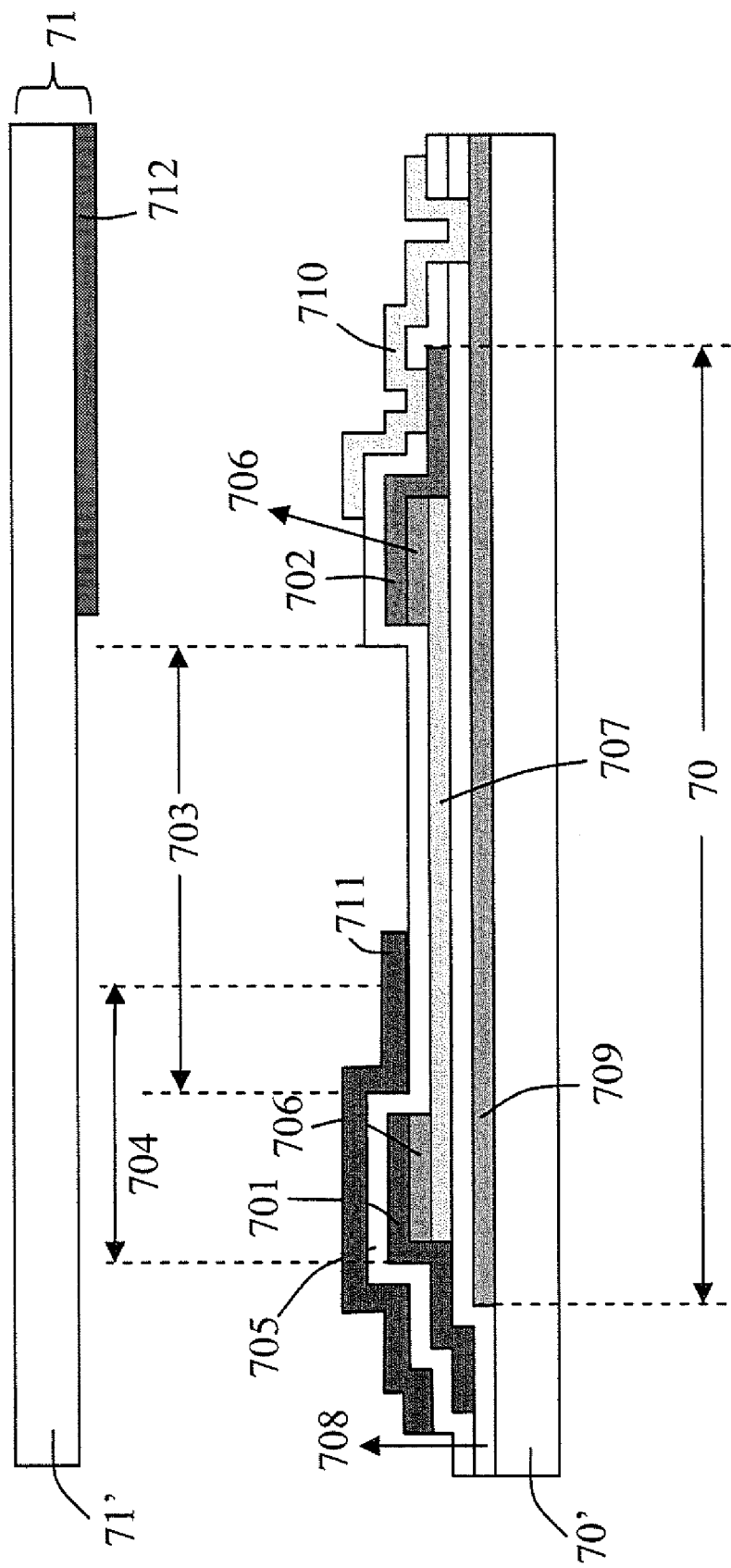
FIG. 7(b) is a cross-sectional view showing the structure of FIG. 7(a) along the dotted line.

Please refer to FIG. 7(a) and FIG. 7(b). FIG. 7(a) is an upper view of an n-type TFT of a light detector array according to the fourth embodiment of the present invention, and FIG. 7(b) is a cross-sectional view showing the structure of FIG. 7(a) along the dotted line. In FIG. 7(a), the TFT 70 is in the area surrounded by data line 1, data line 2, read-out line, gate line 1, and gate line 2 while the remaining components in the area are omitted for the convenience of illustration. The TFT 70 in FIG. 7(a) is implemented to correspond to the photo sensitive switch TFT 71 surrounded by gate line 1, gate line 2, and read-out line 1 shown in FIG. 1. In the upper view of FIG. 7(a), only a part of the components of TFT 70 are shown. To clarify the structure of the TFT 70 of FIG. 7(a), the description for FIG. 7(b) is given firstly as follows.

The main object of the invention is to provide a pixel unit and an input display implemented with a plurality of such pixel unit. As the fourth embodiment of the present invention, both of the pixel unit and the input display are based on the TFT 70 shown in FIG. 7(b).

In FIG. 7(b), the TFT 70 includes at least a high-field electrode 701, a low-field electrode 702, a connecting section 703 for connecting the high-field electrode 701 and the low-field electrode 702, and a metal layer 709. As FIG. 7(b) shows, the connecting section 703 is mainly composed of an amorphous silicon layer 707 and the whole TFT 70 is fabricated on a substrate 70'.

When the TFT 70 is switched OFF, a PN junction field occurs in a field-effect area 704 in part of the connecting section 703 near the high-field electrode 701. When the light is emitted to the field-effect area 704, the electrons would be affected by the incident light and the PN junction field so that a photo-induced leakage current is generated. The object of the invention is to eliminate the photo-induced leakage current.

The n-type TFT 70 is taken for example in FIG. 7, so the high-field electrode 701 and the low-field electrode 702 can be defined as a drain terminal and a source terminal respectively while the gate terminal 709 is at low voltage. If a p-type TFT, however, is taken for another embodiment of the present invention, then the high-field electrode 701 and the low-field electrode 702 should be defined as a drain terminal and a source terminal respectively while the gate terminal 709 is at high voltage. For one skilled in the art, the invention needs not be limited to the disclosed n-type TFT and is easy to be deduced in the applications of the p-type TFT and the poly-TFT.

In the n-type TFT 70 shown in FIG. 7, the high-field electrode 701 and the low-field electrode 702 are defined as a drain terminal and a source terminal respectively. There is a passivation layer 705 covering the high-field electrode 701, the low-field electrode 702 and the connecting section 703. Besides, below the high-field electrode 701 and the low-field electrode 702 are sequentially a $N^+$ amorphous silicon layer 706, an amorphous silicon layer 707, a gate insulator layer 708 and a metal layer 709. There is further an indium-tin-oxide (ITO) layer 710 covering the passivation layer 705 corresponding to the source terminal 702. The ITO layer is also connected to the metal layer 709 so as to connect the low-field electrode 702 to the metal layer 709. The operation of the low voltage is as described in FIG. 1 and will be omitted here.

According to the object of the invention, a light blocking layer is introduced in order to eliminate the photo-induced leakage current. Instead of the BM 411 in FIG. 4(*a*), an additional layer 711 is provided in the fourth embodiment of FIG. 7. The additional layer 711 located on the high-field electrode 701, which is composed of a opaque material, e.g. a kind of metal, is adopted as the light blocking layer to hide the field-effect area 704 from all incident light, so that the light will never emit to or through the field-effect area 704. Hence, the photo-induced leakage current will be eliminated when the TFT 70 is switched OFF, and the photo-induced ON current will still be hold when the TFT 70 is switched ON.

In the production process of a display, the defect of the shifting between layers often occurs. For solving such a defect, in the present invention, the TFT 70 is implemented as the L-type structure shown in FIG. 7(*a*). The TFT structure 70 is set at an angle with respect to the electric field of the PN junction. The angle in this embodiment is 90°.

Although the fourth embodiment is given in the application of an n-type TFT, the present invention is still suitable for the application of a p-type TFT and a poly-TFT. Besides, it can also be utilized for the combination of the fabrication process of a TFT-LCD to widen the utility in the industrial application.

In conclusion, an input display is provided in the present invention. A light blocking layer, for example the black matrix 411 or the layer 711 in the above-mentioned embodiments, is able to hide the PN field-effect area near the high-voltage terminal from all incident light from the TFT. The incident light can not emit to or through the PN field-effect area so that the photo-induced leakage current is eliminated when the TFT is switched OFF. The photo-induced ON current remains almost identical when the TFT is switched ON, regardless of the presence of the light blocking layer. The input display fabricated with the light detector array and the TFT provided in the present invention is able to be fabricated in a higher aperture ratio and a higher production yield.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for eliminating photo-induced leakage current of an input display, comprising steps of:
    providing a photo sensitive transistor comprising a low-field electrode, a high-field electrode connected to said low-field electrode with a connecting section, and a field-effect area positioned in said connecting section and being near to said high-field electrode; and
    hiding said field-effect area from all incident and exposing a portion of said connecting section between said low-field electrode and said high-field electrode to the incident light so that said photo-induced leakage current produced by a plurality of electrons influenced by the incident light when said transistor is switched off is eliminated.

2. The method as claimed in claim 1 further comprising the step of:
    forming a black matrix (BM) located on a first side of a color filter (CF) to hide said field-effect area from the incident light and to expose said portion of said connecting section between said low-field electrode and said high-field electrode to the incident light.

3. The method as claimed in claim 2, wherein said high-field electrode has a side facing said BM and having a passivation layer formed thereon.

4. The method as claimed in claim 1 further comprising the step of:
    forming a light blocking layer located over said high-field electrode to hide said field-effect area from the incident light and to expose said portion of said connecting section between said low-field electrode and said high-field electrode to the incident light.

5. The method as claimed in claim 4 further comprising the step of:
    forming a passivation layer located between said high-field electrode and said light blocking layer.

6. The method as claimed in claim 5 further comprising the step of:
    forming a black matrix (BM) located on a first side of a (color filter) CF and over said low-field electrode.

7. The method as claimed in claim 1, wherein said photo sensitive transistor comprises a thin film transistor (TFT).

8. The method as claimed in claim 7, wherein said TFT comprises a $N^+$ amorphous silicon layer formed below said low-field electrode and said high-field electrode, an amorphous silicon layer formed below said N+ amorphous silicon layer, a gate insulator layer formed below said amorphous silicon layer, and a metal layer formed below said gate insulator layer, and said connecting section comprises said amorphous silicon layer.

9. The method as claimed in claim 8 further comprising the step of:
    providing a gate line to electrically connect to said metal layer to control said TFT.

10. The method as claimed in claim 9 further comprising the step of:
    forming a indium-tin-oxide (ITO) layer to electrically connect said low-field electrode with said metal layer.

11. The method as claimed in claim 9 further comprising the step of:
   providing a read-out line;
   providing a fixed voltage line to provide a fixed voltage thereon, wherein said fixed voltage line is connect said high-field electrode and said read-out line is connected to said low-field electrode.

12. The method as claimed in claim 9 further comprising the step of:
   providing a read-out line;
   providing a fixed voltage line to provide a fixed voltage thereon, wherein said fixed voltage line is connect said low-field electrode and said read-out line is connected to said high-field electrode.

13. An method for eliminating leakage current of an input display, comprising steps of:
   providing a first substrate;
   providing a photo sensitive transistor on said first substrate, wherein said photo sensitive transistor comprises a low-field electrode, a high-field electrode connected to said low-field electrode with a connecting section, and a field-effect area positioned in said connecting section and being near to said high-field electrode; and
   providing a light blocking layer located over said high-field electrode to hide said field-effect area from all incident light and to expose a portion of said connecting section between said low-field electrode and said high-field electrode to the incident light.

14. The method as claimed in claim 13 further comprising the step of:
   providing a second substrate facing said first substrate to form a color filter (CF), wherein said light blocking layer is located on said second substrate as a black matrix (BM).

15. The method as claimed in claim 13, wherein said light blocking layer is located on said first substrate and a passivation layer is provided between said high-field electrode and said light blocking layer.

16. The method as claimed in claim 13, wherein said photo sensitive transistor comprises a thin film transistor (TFT) and said TFT comprises a $N^+$ amorphous silicon layer formed below said low-field electrode and said high-field electrode, an amorphous silicon layer formed below said $N^{30}$ amorphous silicon layer, a gate insulator layer formed below said amorphous silicon layer, and a metal layer formed below said gate insulator layer, and said connecting section comprises said amorphous silicon layer.

17. The method as claimed in claim 16 further comprising the step of:
   providing a gate line to electrically connect to said metal layer to control said TFT.

18. The method as claimed in claim 17 further comprising the step of:
   forming a indium-tin-oxide (ITO) layer to electrically connect said low-field electrode with said metal layer.

19. The method as claimed in claim 17 further comprising the step of:
   providing a read-out line; and
   providing a fixed voltage line to provide a fixed voltage thereon, wherein said fixed voltage line is connect said high-field electrode and said read-out line is connected to said low-field electrode.

20. The method as claimed in claim 17 further comprising the step of:
   providing a read-out line; and
   providing a fixed voltage line to provide a fixed voltage thereon, wherein said fixed voltage line is connect said low-field electrode and said read-out line is connected to said high-field electrode.

* * * * *

UNITED STATES PATENT AND TRADEMARK OFFICE
CERTIFICATE OF CORRECTION

PATENT NO. : 7,948,047 B2
APPLICATION NO. : 12/417636
DATED : May 24, 2011
INVENTOR(S) : Po-Sheng Shih Page 1 of 1

It is certified that error appears in the above-identified patent and that said Letters Patent is hereby corrected as shown below:

Title Page; under item (65), Insert item --(62) "Related U.S. Application Data--, and add --Division of application No. 11/335,042, filed on Jan. 18, 2006, now Pat. No. 7,535,072.--

Signed and Sealed this
Twenty-sixth Day of July, 2011

David J. Kappos
*Director of the United States Patent and Trademark Office*